(12) United States Patent
Shin et al.

(10) Patent No.: US 12,221,686 B2
(45) Date of Patent: Feb. 11, 2025

(54) SPUTTERING TARGET AND SPUTTERING APPARATUS INCLUDING THE SAME

(71) Applicant: Samsung Display Co., Ltd., Yongin-Si (KR)

(72) Inventors: Hyuneok Shin, Yongin-si (KR); Joonyong Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/132,420

(22) Filed: Apr. 10, 2023

(65) Prior Publication Data

US 2024/0084441 A1 Mar. 14, 2024

(30) Foreign Application Priority Data

Sep. 14, 2022 (KR) .................. 10-2022-0115552

(51) Int. Cl.
*C23C 14/34* (2006.01)
*C23C 14/08* (2006.01)
*H01J 37/34* (2006.01)
*H01L 27/12* (2006.01)

(52) U.S. Cl.
CPC ........ *C23C 14/3407* (2013.01); *C23C 14/086* (2013.01); *H01J 37/3417* (2013.01); *H01J 37/3426* (2013.01); *H01J 37/3435* (2013.01); *H01J 2237/332* (2013.01); *H01L 27/1225* (2013.01)

(58) Field of Classification Search
CPC .............. C23C 14/3407; H01J 37/3417; H01J 37/3426
See application file for complete search history.

(56) References Cited

U.S. PATENT DOCUMENTS

| 8,551,307 B2 * | 10/2013 | Kim | H01J 37/342 |
| | | | 204/298.12 |
| 2007/0289864 A1 * | 12/2007 | Ye | C23C 14/3407 |
| | | | 204/192.1 |

FOREIGN PATENT DOCUMENTS

| JP | 2000-144400 A | 5/2000 |
| JP | 2015-059269 A | 3/2015 |
| KR | 10-1383280 B1 | 4/2014 |
| WO | WO-2014131458 A1 * | 9/2014 ......... C23C 14/3407 |

* cited by examiner

*Primary Examiner* — John J Brayton
(74) *Attorney, Agent, or Firm* — Innovation Counsel LLP

(57) ABSTRACT

A sputtering target includes a first target part and a second target part both including a metal oxide and adjacent to each other and a target dividing part disposed between a first target part and a second target part. The target dividing part includes a same metal element as a metal element included in a first target part and a second target part. Therefore, size and/or length of the sputtering target may be increased. Thus, efficiency of a manufacturing process of the sputtering target is improved and a manufacturing cost is reduced. In addition, even after a thin film is deposited on a target substrate using the sputtering target, stains caused by sputtering of non-uniform amounts of metal elements by location on the target substrate do not occur on a target substrate. In addition, the uniformity of a thin film deposited on a target substrate is secured by using the sputtering target. Thus, process quality of a sputtering process is improved.

18 Claims, 5 Drawing Sheets

SPUTTERING TARGET AND SPUTTERING APPARATUS INCLUDING THE SAME

This application claims priority to Korean Patent Application No. 10-2022-0115552, filed on Sep. 14, 2022, and all the benefits accruing therefrom under 35 U.S.C. § 119, the content of which in its entirety is herein incorporated by reference.

BACKGROUND

1. Field

Embodiments relate to a sputtering target and sputtering apparatus including the sputtering target.

2. Description of the Related Art

As information technology develops, the importance of display devices, which are communication media between users and information, is being highlighted. Accordingly, the use of display devices such as liquid crystal display devices, organic light emitting display devices, plasma display devices, or the like is increasing.

The display device includes a plurality of thin films formed on a substrate. Methods for forming the thin films include chemical vapor deposition (CVD) and physical vapor deposition (PVD). Among them, physical vapor deposition includes a sputtering process, a thermal evaporation process, an E-beam evaporation process, or the like.

The sputtering process has the advantage of easily obtaining the thin film regardless of the material of the substrate, and is widely used in the manufacturing process of the display device. However, as the display device becomes larger in size, more sophistication of the thin film forming process is required. In particular, the uniformity of the thin film is an important factor that determines the quality or performance of the display device, and various attempts are being made to improve the uniformity of the thin film.

SUMMARY

Embodiments provide a sputtering target that improves the process quality of the sputtering process.

Embodiments provide a sputtering apparatus including the sputtering target.

A sputtering target according to an embodiment includes a first target part, a second target part, and a target dividing part. The first target part and the second target part are adjacent to each other, the first target part and the second target part both including a metal oxide. The target dividing part is disposed between the first target part and the second target part and includes a same metal element as a metal element included in the first target part and the second target part.

In an embodiment, the metal oxide may include at least one selected from the group consisting of zinc oxide (ZnOx), gallium oxide (GaOx), tin oxide (SnOx), titanium oxide (TiOx), indium oxide (InOx), indium-gallium oxide (IGO), indium-Zinc Oxide (IZO), Gallium-Zinc Oxide (GZO), Zinc-Tin Oxide (ZTO), Zinc-Magnesium Oxide (ZMO), Zinc-Zirconium Oxide (ZnZrxOy), Indium-Zinc-Tin Oxide (IZTO), Indium-Zinc Oxide (IZTO) gallium-zinc oxide (IGZO), indium-gallium-hafnium oxide (IGHO), tin-aluminum-zinc oxide (TAZO), indium-gallium-tin oxide (IGTO), and indium-tin-gallium-zinc oxide (ITGZO).

In an embodiment, the metal element may include at least one selected from the group consisting of zinc (Zn), gallium (Ga), tin (Sn), indium (In), titanium (Ti), magnesium (Mg), zirconium (Zr), aluminum (Al), and hafnium (Hf).

In an embodiment, each of the first target part, the second target part, and the target dividing part may include a plurality of the metal elements, and a composition ratio of the metal elements included in the target dividing part may be the same as a composition ratio of the metal elements included in each of the first target part and the second target part.

In an embodiment, each of the first target part and the second target part may include indium-gallium-zinc oxide (IGZO), the target dividing part may include indium (In), gallium (Ga), and zinc (Zn), and a content of indium (In) of the target dividing part, a content of gallium (Ga) of the target dividing part, and a content of zinc (Zn) of the target dividing part may be the same.

In an embodiment, the first target part and the second target part may be spaced apart from each other.

In an embodiment, the sputtering target may further include a rotating roller supporting the first target part and the second target part.

In an embodiment, the first target part and the second target part may surround the rotating roller.

In an embodiment, the rotating roller may have a cylindrical shape.

In an embodiment, the first target part and the second target part may have a cylindrical shape.

In an embodiment, the first target part and the second target part have a flat plate shape.

A sputtering apparatus according to an embodiment includes a chamber, a stage, a plate, and a sputtering target. The chamber defines an inner space. The stage is disposed in the chamber and on which a target substrate is configured to be disposed. The plate is disposed in the chamber and faces the stage. The sputtering target is disposed on the plate. The sputtering target includes a first target part and a second target part adjacent to each other, the first target part and the second target part including a metal oxide. The sputtering target further includes a target dividing part disposed between the first target part and the second target part and including a same metal element as a metal element included in the first target part and the second target part.

In an embodiment, oxygen may exist in the inner space of the chamber.

In an embodiment, the oxygen may be deposited on the target substrate by reacting with the metal element of the target dividing part.

In an embodiment, the metal oxide may include at least one selected from the group consisting of zinc oxide (ZnOx), gallium oxide (GaOx), tin oxide (SnOx), titanium oxide (TiOx), indium oxide (InOx), indium-gallium oxide (IGO), indium-Zinc Oxide (IZO), Gallium-Zinc Oxide (GZO), Zinc-Tin Oxide (ZTO), Zinc-Magnesium Oxide (ZMO), Zinc-Zirconium Oxide (ZnZrxOy), Indium-Zinc-Tin Oxide (IZTO), Indium-Zinc Oxide (IZTO) gallium-zinc oxide (IGZO), indium-gallium-hafnium oxide (IGHO), tin-aluminum-zinc oxide (TAZO), indium-gallium-tin oxide (IGTO), and indium-tin-gallium-zinc oxide (ITGZO).

In an embodiment, the metal element may include at least one selected from the group consisting of zinc (Zn), gallium (Ga), tin (Sn), indium (In), titanium (Ti), magnesium (Mg), zirconium (Zr), aluminum (Al), and hafnium (Hf).

In an embodiment, each of the first target part, the second target part, and the target dividing part may include a plurality of the metal elements, and a composition ratio of the metal elements included in the target dividing part may be the same as a composition ratio of the metal elements included in each of the first target part and the second target part.

In an embodiment, the first target part and the second target part may be spaced apart from each other.

In an embodiment, the target dividing part may be disposed to fill a space between the first target part and the second target part.

Therefore, the sputtering apparatus according to embodiments may include the sputtering target including the first target part, the second target part, and the target dividing part disposed between the first target part and the second target part. In other words, the sputtering target may have a structure including the first target part and the second target part divided by the target dividing part. Accordingly, the size and/or length of the sputtering target may be increased. Accordingly, it may be easy to design the sputtering target suitable for a substrate having a large size. Thus, efficiency of a manufacturing process of the sputtering target may be improved and a manufacturing cost may be reduced.

In addition, the target dividing part may include a same metal element as a metal element included in the first target part and the second target part. Accordingly, even after a thin film is deposited on the target substrate using the sputtering target, stains caused by sputtering of non-uniform amounts of metal elements by location on the target substrate may not occur on the target substrate. In addition, the uniformity of the thin film deposited on the target substrate may be secured by using the sputtering target. Thus, process quality of the sputtering process may be improved. In addition, performance of an oxide transistor formed by a sputtering process using the sputtering apparatus may be improved. Accordingly, performance of a display device including the oxide transistor may be improved.

It is to be understood that both the foregoing general description and the following detailed description are exemplary and explanatory and are intended to provide further explanation of the inventive concept as claimed.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Figure 1:
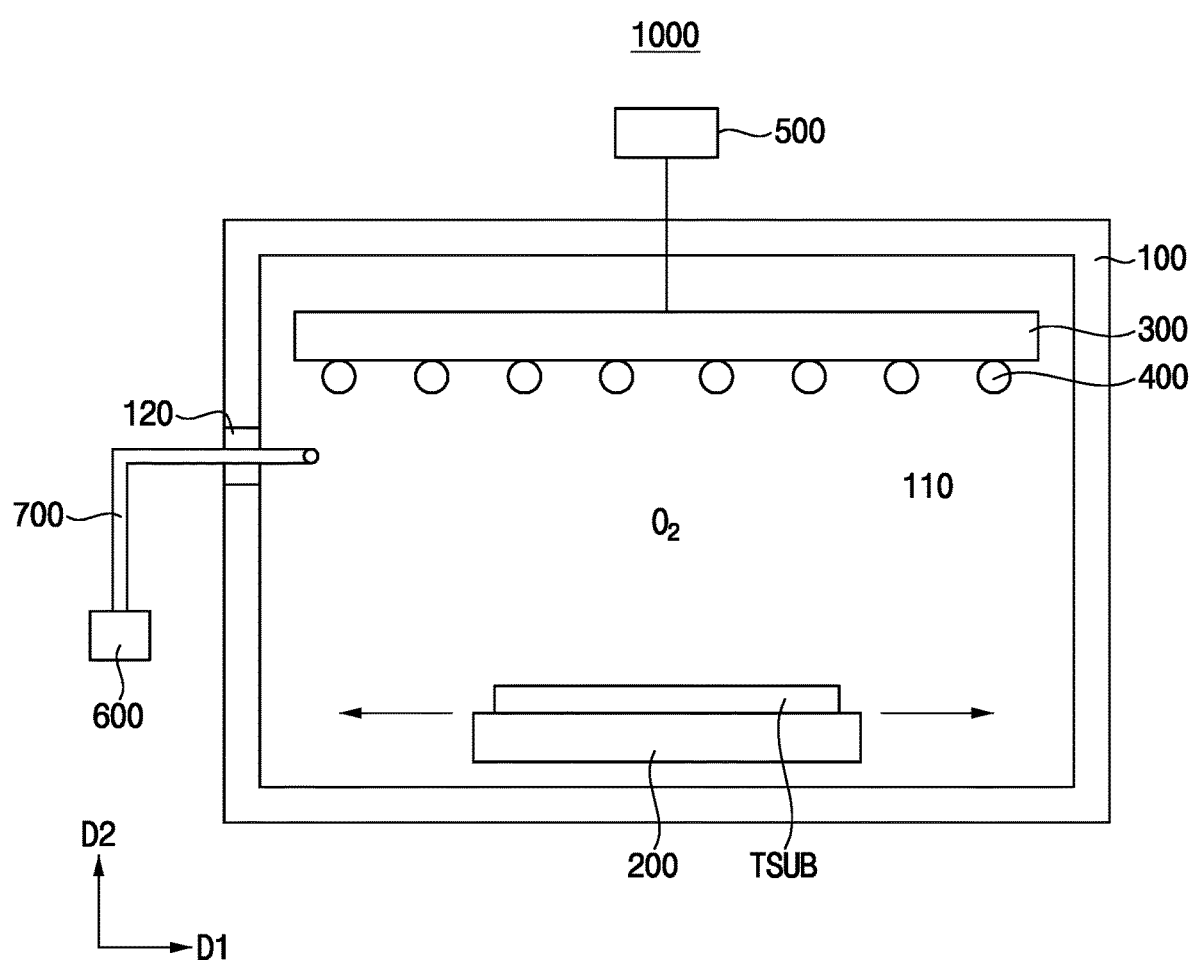
FIG. 1 is a view illustrating a sputtering apparatus according to an embodiment.

The inventive concept now will be described more fully hereinafter with reference to the accompanying drawings, in which various embodiments are shown. The inventive concept may, however, be embodied in many different forms, and should not be construed as limited to the embodiments set forth herein. Rather, these embodiments are provided so that this disclosure will be thorough and complete, and will fully convey the scope of the inventive concept to those skilled in the art. Like reference numerals refer to like elements throughout.

FIG. 1 is a view illustrating a sputtering apparatus 1000 according to an embodiment.

Referring to FIG. 1, the sputtering apparatus 1000 according to an embodiment may include a chamber 100, a stage 200, a plate 300, sputtering targets 400, a power supply part 500, a gas supply part 600, and a gas supply pipe 700.

The sputtering apparatus 1000 may perform a sputtering process, which is one of the methods of depositing a thin film on a target substrate TSUB. In an embodiment, the sputtering apparatus 1000 may perform a process of depositing an oxide thin film on the target substrate TSUB.

In an embodiment, the target substrate TSUB may be a display substrate. For example, the target substrate TSUB may be a substrate for a display device such as an organic light emitting display device, a liquid crystal display device, or a plasma display device. The target substrate TSUB may be a bare substrate or a substrate on which a structure such as a thin film or a wiring is formed.

The chamber 100 may define an inner space 110 in which a sputtering process is performed. The stage 200, the plate 300, and the sputtering targets 400 may be disposed in the inner space 110 of the chamber 100.

In an embodiment, the gas supply part 600 supplying an inert gas to the inner space 110 of the chamber 100 may be located at one side of the chamber 100. In an embodiment, the gas supply part 600 may be connected to the chamber 100 through the gas supply pipe 700. The gas supply pipe 700 may be connected to a gas supply port 120 formed on one side of the chamber 100. In other words, the gas supply pipe 700 may be introduced into the inner space 110 of the chamber 100 through the gas supply port 120.

In an embodiment, the gas supply part 600 may further supply a reactive gas to the inner space 110 of the chamber 100. In other words, the sputtering apparatus 1000 may be a reactive sputtering apparatus. For example, the reactive gas may be oxygen (O2). Accordingly, the oxygen (O2) may exist in the inner space 110 of the chamber 100. In an embodiment, a partial pressure of the oxygen (O2) in the inner space 110 of the chamber 100 may be about 30% to about 60% of a total pressure of the inner space 110 of the chamber 100. Specifically, a partial pressure of the oxygen (O2) in the inner space 110 of the chamber 100 may be about 50% to about 60% of a total pressure of the inner space 110 of the chamber 100.

In an embodiment, the oxygen (O2) may be deposited on the target substrate TSUB by reacting with a metal element of a target dividing part of the sputtering targets 400. This will be described later in more detail with reference to FIG. 2.

Although not shown, a gas discharge pipe through which gas remaining in the inner space 110 of the chamber 100 is exhausted after the sputtering process may be located at one side of the chamber 100. In addition, an entrance through which the target substrate TSUB is introduced into or taken out of the inner space 110 of the chamber 100 may be formed on the other side of the chamber 100.

The stage 200 may be disposed on one side of the inner space 110 of the chamber 100 and may provide a space in which the target substrate TSUB is disposed.

In an embodiment, the stage 200 may move reciprocally. For example, the stage 200 may move reciprocally in a first direction D1. Accordingly, the target substrate TSUB disposed on the stage 200 may move reciprocally in the first direction D1.

The plate 300 may be disposed on the other side of the inner space 110 of the chamber 100 opposite the stage 200. For example, the plate 300 may face the stage 200. For example, the plate 300 may face the stage 200 in a second direction D2 perpendicular to the first direction D1. The plurality of sputtering targets 400 may be disposed on the plate 300. In other words, the plate 300 may be disposed on the rear surface of the sputtering targets 400. Accordingly, the plate 300 may support the sputtering targets 400.

In an embodiment, the plate 300 may be connected to the power supply part 500. The power supply part 500 may supply power to the plate 300. The plate 300 may apply power supplied from the power supply part 500 to the sputtering targets 400. The plate 300 may also be referred to as a backing plate.

In an embodiment, the plate 300 may include a metal material. Examples of
materials that can be used as the plate 300 may include stainless steel, copper, titanium, aluminum, or the like. These may be used alone or in combination with each other.

According to an example of a method of forming a thin film on the target substrate TSUB by using the sputtering apparatus 1000, first, the target substrate TSUB may be disposed on the stage 200 disposed in the inner space 110 of the chamber 100. Target materials emitted from the sputtering targets 400 disposed to face the stage 200 may be deposited on the target substrate TSUB by a sputtering process.

In an embodiment, the sputtering process may include the following process. Power may be applied to the plate 300 and the sputtering targets 400 from the power supply part 500. An inert gas, e.g., argon (Ar), and a reactive gas, e.g., oxygen (O2), may be supplied to the inner space 110 of the chamber 100 through the gas supply part 600 and the gas supply pipe 700. The inert gas may be ionized by an electric field formed in the inner space 110 of the chamber 100 to generate plasma, and ions ionized from the inert gas may collide with the sputtering targets 400. Accordingly, the target materials may be released from the sputtering targets 400. The target materials may react with the reactive gas and be deposited on the target substrate TSUB.

Meanwhile, the structure of the sputtering apparatus 1000 shown in FIG. 1 is only an example and may be variously changed. For example, the sputtering apparatus 1000 may further include a magnet forming a magnetic field or a mask disposed between the target substrate TSUB and the sputtering targets 400. In addition, the process of the above-described sputtering process is also only an example, and may be variously changed according to the structure of the sputtering apparatus 1000, or the like.

Figure 2:
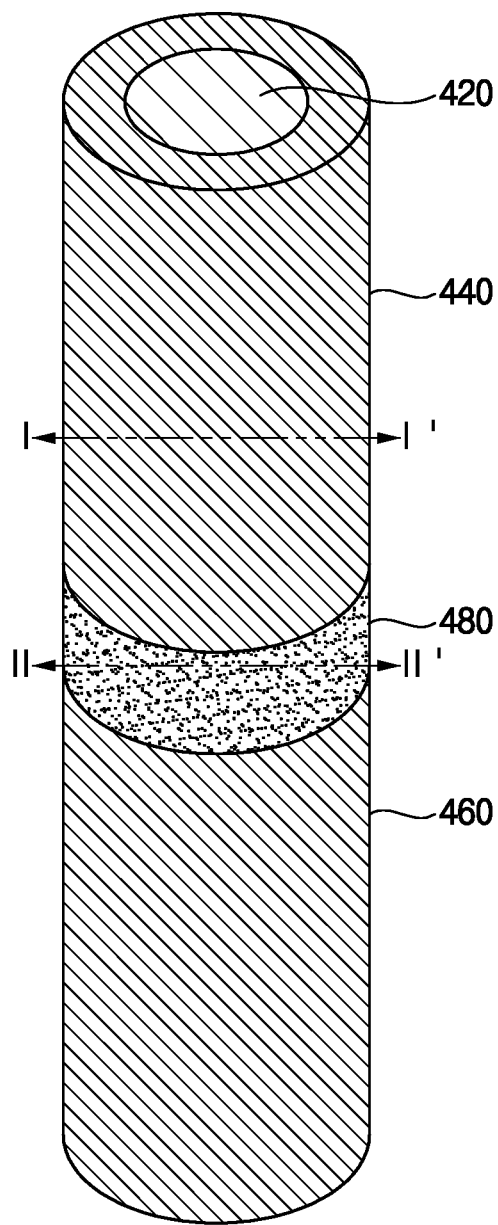
FIG. 2 is a schematic perspective view illustrating a sputtering target included in a sputtering apparatus of FIG. 1.
Figure 3:
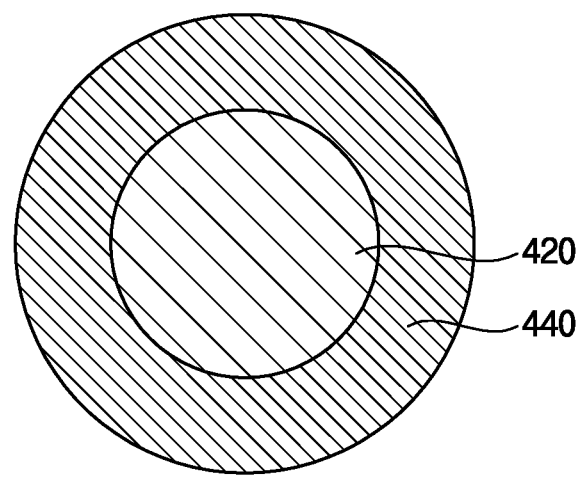
FIG. 3 is a cross-sectional view taken along line I-I' of FIG. 2.
Figure 4:
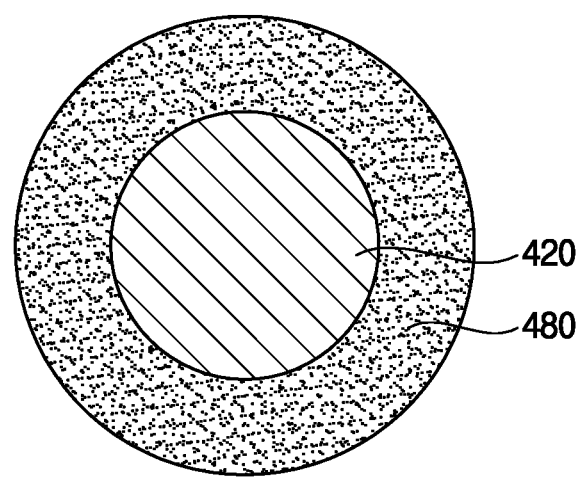
FIG. 4 is a cross-sectional view taken along line II-II' of FIG. 2.

FIG. 2 is a schematic perspective view illustrating a sputtering target 400 included in the sputtering apparatus 1000 of FIG. 1. FIG. 3 is a cross-sectional view taken along line I-I' of FIG. 2. FIG. 4 is a cross-sectional view taken along line II-II' of FIG. 2.

Hereinafter, with reference to FIGS. 1 to 4, the sputtering target 400 according to an embodiment will be described in more detail. Although a single sputtering target 400 is illustrated and discussed, generally, the sputtering apparatus 1000 includes one or more sputtering targets 400. The discussing of the sputtering target 400 is applicable to all of the sputtering targets 400 in an embodiment.

Referring to FIGS. 1 to 4, in an embodiment, the sputtering target 400 may have a cylindrical shape. The sputtering target 400 may include a rotating roller 420, a first target part 440, a second target part 460, and a target dividing part 480.

The rotating roller 420 may support the first target part 440, the second target part 460, and the target dividing part 480. Also, the rotating roller 420 may rotate the first target part 440, the second target part 460, and the target dividing part 480. In an embodiment, the rotating roller 420 may have a cylindrical shape.

In an embodiment, the rotating roller 420 may include a metal material. Examples of materials that can be used as the rotating roller 420 may include stainless steel, copper, titanium, aluminum, or the like. These may be used alone or in combination with each other.

The first target part 440, the second target part 460, and the target dividing part 480 may surround the rotating roller 420. Accordingly, as shown in FIGS. 3 and 4, the inner profile of the first target part 440 and the inner profile of the target dividing part 480 may correspond to the outer profile of the rotating roller 420. Also, although not shown, the inner profile of the second target part 460 may correspond to the outer profile of the rotating roller 420.

In an embodiment, the first target part 440 and the second target part 460 may have a cylindrical shape. For example, the first target part 440 and the second target part 460 may have a hollow cylindrical shape.

The first target part 440 and the second target part 460 may be adjacent, e.g., near, to each other. The target dividing part 480 may be disposed between the first target part 440 and the second target part 460. For example, the first target part 440 and the second target part 460 may be spaced apart from each other. The target dividing part 480 may be disposed to fill a space formed by being spaced apart the first target part 440 and the second target part 460 from each other. In other words, the first target part 440 and the second target part 460 may be divided by the target dividing part 480 and the target dividing part 480 may be disposed to fill a space between the first target part 440 and the second target part 460.

Since the first target part 440 and the second target part 460 are divided by the target dividing part 480, the size and/or length of the sputtering target 400 may be increased. Accordingly, it may be easy to design the sputtering target 400 suitable for a substrate having a large size. Thus, efficiency of a manufacturing process of the sputtering target 400 may be improved and a manufacturing cost may be reduced.

In an embodiment, the first target part 440 and the second target part 460 may include a metal oxide. Examples of the metal oxide that can be used as the first target part 440 and the second target part 460 may include zinc oxide (ZnOx), gallium oxide (GaOx), tin oxide (SnOx), and titanium oxide (TiOx).), indium oxide (InOx), indium-gallium oxide (IGO), indium-zinc oxide (IZO), gallium-zinc oxide (GZO), zinc-tin oxide (ZTO), zinc-magnesium oxide (ZMO), zinc-Zirconium oxide (ZnZrxOy), indium-zinc-tin oxide (IZTO), indium-gallium-zinc oxide (IGZO), indium-gallium-hafnium oxide (IGHO), tin-aluminum-zinc oxide (TAZO), indium-gallium-tin oxide (IGTO), indium-tin-gallium-zinc oxide (ITGZO), or the like. These may be used alone or in combination with each other.

The metal oxide included in the first target part 440 and the second target part 460 may be deposited on the target substrate TSUB while the sputtering process is in progress. In other words, the metal oxide may be the target material deposited on the target substrate TSUB by the sputtering apparatus 1000. Accordingly, an oxide thin film may be deposited on the target substrate TSUB.

A type of the metal oxide included in the first target part 440 and the second target part 460 may be variously determined according to a material to be deposited on the target substrate TSUB.

In an embodiment, the target dividing part 480 may include a same metal element as a metal element included in the first target part 440 and the second target part 460. In other words, the target dividing part 480 may include the same metal element as the metal element constituting the metal oxide included in the first target part 440 and the second target part 460. Examples of the metal element that can be used as the target dividing part 480 include zinc (Zn), gallium (Ga), tin (Sn), indium (In), titanium (Ti), magnesium (Mg), zirconium (Zr), aluminum (Al), hafnium (Hf), or the like. These may be used alone or in combination with each other.

In an embodiment, each of the first target part 440 and the second target part 460 may include indium-gallium-zinc oxide (IGZO) and the target dividing part 480 may include indium (In), Gallium (Ga) and zinc (Zn). In an embodiment, each of the first target part 440 and the second target part 460 may include indium-tin-gallium-zinc oxide (ITGZO) and the target dividing part 480 may include indium (In), tin (Sn), Gallium (Ga) and zinc (Zn).

In an embodiment, each of the first target part 440, the second target part 460, and the target dividing part 480 may include a plurality of the metal elements, and a composition ratio of the metal elements included in the target dividing part 480 may be the same as a composition ratio of the metal elements included in each of the first target part 440 and the second target part 460.

For example, each of the first target part 440 and the second target part 460 may include indium-gallium-zinc oxide (IGZO), the target dividing part 480 may include indium (In), gallium (Ga) and zinc (Zn), and a content of indium (In) of the target dividing part 480, a content of gallium (Ga) of the target dividing part 480 and a content of zinc (Zn) of the target dividing part 480 may be the same. In other words, each of the first target part 440 and the second target part 460 may include indium-gallium-zinc oxide (IGZO), the target dividing part 480 may include indium (In), gallium (Ga) and zinc (Zn), the composition ratio of indium (In), gallium (Ga), and zinc (Zn) included in the target dividing part 480 may be 1:1:1.

In an embodiment, the metal element included in the target dividing part 480 may react with the oxygen (O2) present in the inner space 110 of the chamber 100 while the sputtering process is in progress and deposit on the target substrate TSUB. In other words, the metal element included in the target dividing part 480 may function together with the oxygen (O2) as the target material deposited on the target substrate TSUB by the sputtering apparatus 1000.

Accordingly, a composition of a thin film formed on the target substrate TSUB by depositing the metal element included in the target dividing part 480 may be substantially the same or similar as a composition of a thin film on the target substrate TSUB by depositing the metal oxide included in the first target part 440 and the second target part 460. Accordingly, uniformity of a thin film deposited on the target substrate TSUB may be secured using the sputtering target 400.

FIG. 2 shows that one sputtering target 400 has one first target part 440, one second target part 460, and one target dividing part 480. However, in an embodiment, one sputtering target 400 may include a plurality of first target parts 440, a plurality of second target parts 460, and a plurality of target dividing parts 480.

Figure 5:
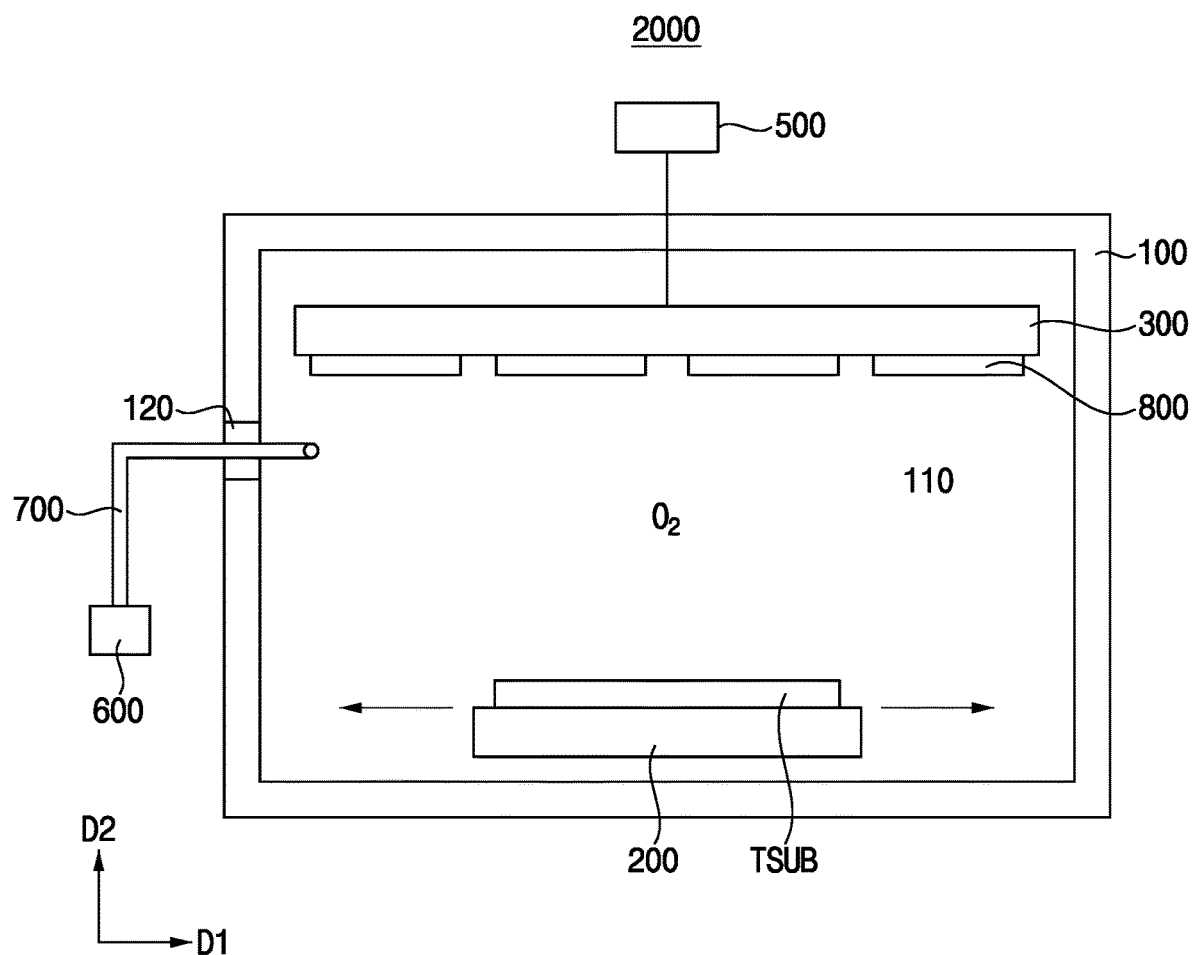
FIG. 5 is a view illustrating a sputtering apparatus according to an embodiment.
Figure 6:
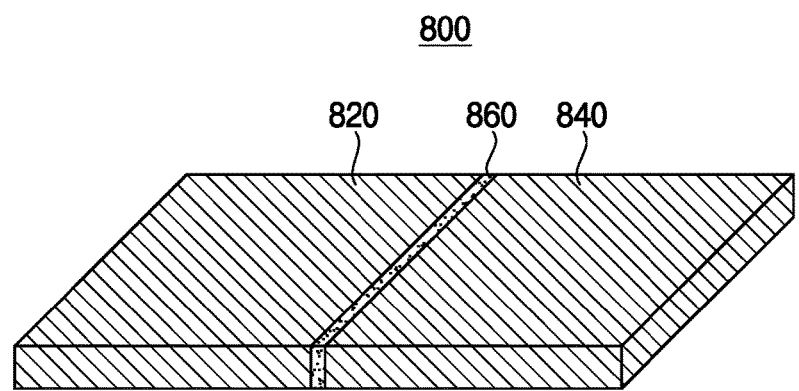
FIG. 6 is a schematic perspective view illustrating a sputtering target included in the sputtering apparatus of FIG. 5.

FIG. 5 is a view illustrating a sputtering apparatus 2000 according to an embodiment. FIG. 6 is a schematic perspective view illustrating a sputtering target 800 included in the sputtering apparatus 2000 of FIG. 5.

Referring to FIGS. 5 and 6, the sputtering apparatus 2000 according to an embodiment may be substantially the same as the sputtering apparatus 1000 described with reference to FIGS. 1 to 4, except for the shape of the sputtering target 800. Therefore, repeated descriptions will be omitted or simplified.

In an embodiment, the sputtering target 800 may have a flat plate shape. For example, the sputtering target 800 may have a rectangular flat plate shape. However, the sputtering target 800 may have a flat plate shape such as a square or a parallelogram in an embodiment.

The sputtering target 800 may include a first target part 820, a second target part 840, and a target dividing part 860.

The first target part 820 and the second target part 840 may have a flat plate shape. For example, each of the first target part 820 and the second target part 840 may have a rectangular planar shape. However, each of the first target part 820 and the second target part 840 may have a flat plate shape such as a square or a parallelogram in an embodiment.

The first target part 820 and the second target part 840 may be adjacent to each other. For example, the first target part 820 and the second target part 840 may be spaced apart from each other. For example, a space formed by being spaced apart the first target part 820 and the second target part 840 from each other may extend to and expose a portion of the plate 300. The target dividing part 860 may be disposed between the first target part 820 and the second target part 840. For example, the target dividing part 860 may be disposed to fill a space formed by being spaced apart the first target part 820 and the second target part 840 from each other. In other words, the first target part 820 and the second target part 840 may be divided by the target dividing part 860 and the target dividing part 860 may be disposed to fill a space between the first target part 820 and the second target part 840.

In an embodiment, the first target part 820 and the second target part 840 may include a metal oxide. Examples of the metal oxide that can be used as the first target part 820 and the second target part 840 may include zinc oxide (ZnOx), gallium oxide (GaOx), tin oxide (SnOx), and titanium oxide (TiOx).), indium oxide (InOx), indium-gallium oxide (IGO), indium-zinc oxide (IZO), gallium-zinc oxide (GZO), zinc-tin oxide (ZTO), zinc-magnesium oxide (ZMO), zinc-Zirconium oxide (ZnZrxOy), indium-zinc-tin oxide (IZTO), indium-gallium-zinc oxide (IGZO), indium-gallium-hafnium oxide (IGHO), tin-aluminum-zinc oxide (TAZO), indium-gallium-tin oxide (IGTO), indium-tin-gallium-zinc oxide (ITGZO), or the like. These may be used alone or in combination with each other.

In an embodiment, the target dividing part 860 may include a same metal element as a metal element included in the first target part 820 and the second target part 840. In other words, the target dividing part 860 may include the same metal element as the metal element constituting the metal oxide included in the first target part 820 and the second target part 840. Examples of the metal element that can be used as the target dividing part 860 include zinc (Zn), gallium (Ga), tin (Sn), indium (In), titanium (Ti), magnesium (Mg), zirconium (Zr), aluminum (Al), hafnium (Hf), or the like. These may be used alone or in combination with each other.

In an embodiment, each of the first target part 820, the second target part 840, and the target dividing part 860 may include a plurality of the metal elements, and a composition ratio of the metal elements included in the target dividing part 480 may be the same as a composition ratio of the metal elements included in each of the first target part 440 and the second target part 460.

FIG. 2 shows that one sputtering target 800 has one first target part 820, one second target part 840, and one target dividing part 860. However, one sputtering target 800 may include a plurality of first target parts 820, a plurality of second target parts 840, and a plurality of target dividing parts 860 in an embodiment.

According to embodiments, the sputtering target 800 may include the first target part 820, the second target part 840, and the target dividing part 860 disposed between the first target part 820 and the second target part 840. In other words, the target dividing part 860 may be disposed to fill a space formed between the first target part 820 and the second target part 840. In addition, the target dividing part 860 may include a same metal element as a metal element included in the first target part 820 and the second target part 840. Accordingly, even after a thin film is deposited on the target substrate TSUB using the sputtering target 800, stains caused by sputtering of non-uniform amounts of metal elements by location on the target substrate due to the space may not occur on the target substrate TSUB. In addition, the uniformity of the thin film deposited on the target substrate TSUB may be secured by using the sputtering target 800. Thus, process quality of the sputtering process may be improved.

Figure 7:
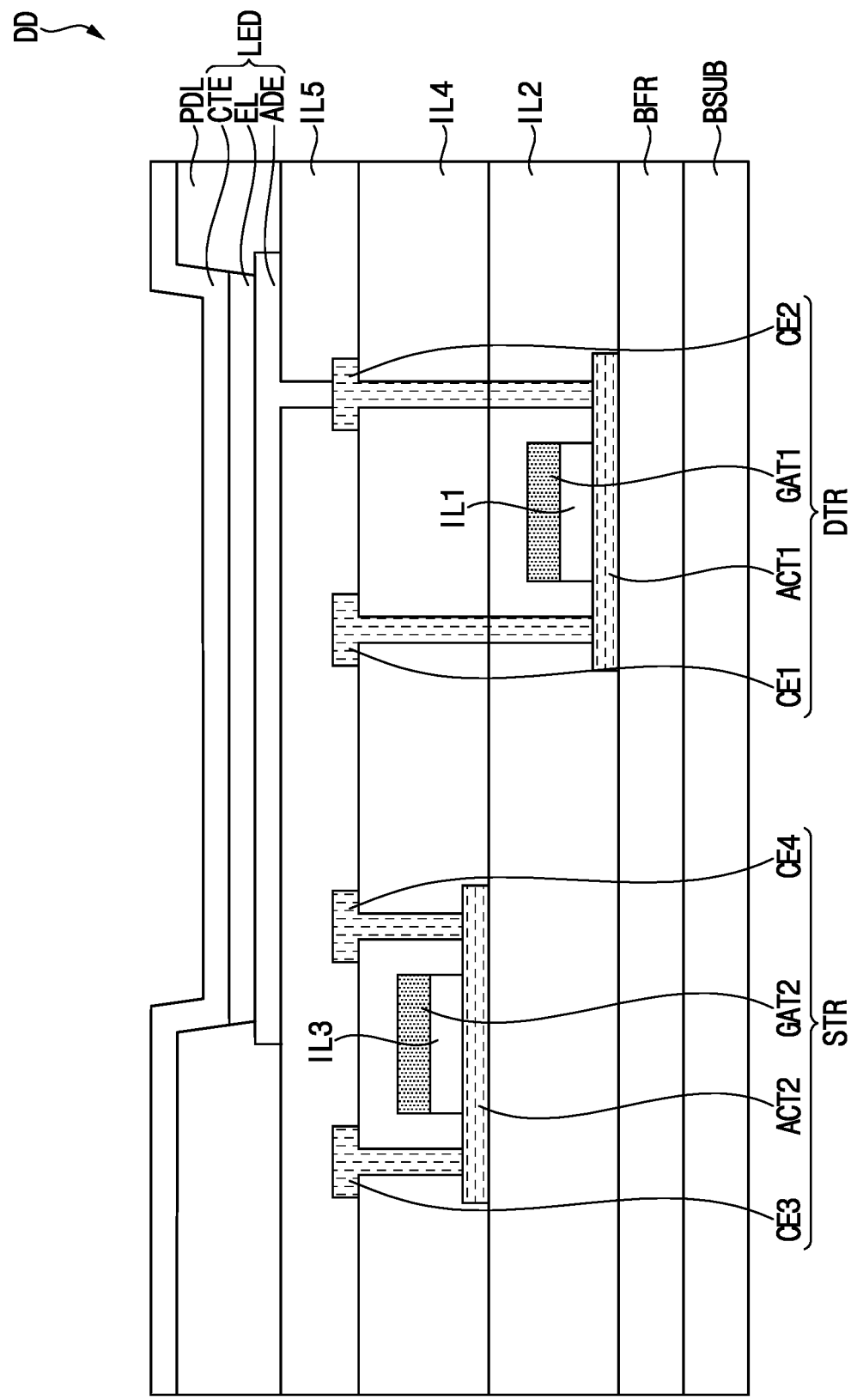
FIG. 7 is a cross-sectional view illustrating a display device that is an example of an object that can be formed using a sputtering apparatus of FIG. 1.

FIG. 7 is a cross-sectional view illustrating a display device DD that is an example of an object that can be formed using a sputtering apparatus 1000 of FIG. 1. For example, FIG. 7 is a cross-sectional view illustrating a sub-pixel of the display device DD, which is an example of the object. Although the display device DD is described below as being formed using the sputtering apparatus 1000 of FIG. 1, in an embodiment, the display device DD is formed using the sputtering apparatus 2000 of FIG. 5 in a similar manner.

Hereinafter, referring to FIG. 7, as an example of the object that can be formed by depositing an oxide thin film on the target substrate TSUB using the sputtering apparatus 1000 according to embodiments, a structure of an organic light emitting display device will be described.

The display device DD may include a base substrate BSUB, a buffer layer BFR, a driving transistor DTR, a switching transistor STR, a plurality of insulating layers IL1, IL2, IL3, IL4, and IL5, a pixel defining layer PDL, and a light emitting device LED. The driving transistor DTR may include a first active pattern ACT1, a first gate electrode GAT1, a first connection electrode CE1, and a second connection electrode CE2. The switching transistor STR may include a second active pattern ACT2, a second gate electrode GAT2, a third connection electrode CE3 and a fourth connection electrode CE4.

The base substrate BSUB may include a transparent material or an opaque material. In one embodiment, examples of materials that can be used as the base substrate BSUB may include glass, quartz, plastic, or the like. These may be used alone or in combination with each other.

The buffer layer BFR may be disposed on the base substrate BSUB. In an embodiment, the buffer layer BFR may be formed of an inorganic insulating material. The buffer layer BFR may prevent metal atoms or impurities from diffusing into the first active pattern ACT1 from the base substrate BSUB.

The first active pattern ACT1 may be disposed on the buffer layer BFR. In an embodiment, the first active pattern ACT1 may be formed by depositing an oxide thin film on the buffer layer BFR using the sputtering apparatus 1000. Accordingly, the first active pattern ACT1 may include an oxide semiconductor. In other words, the oxide semiconductor included in the first active pattern ACT1 may correspond to the metal oxide included in the first target part and the second target part of the sputtering apparatus.

Examples of the oxide semiconductor that can be used as the first active pattern ACT1 may include zinc oxide (ZnOx), gallium oxide (GaOx), tin oxide (SnOx), titanium oxide (TiOx), indium oxide (InOx), indium-Gallium Oxide (IGO), Indium-Zinc Oxide (IZO), Gallium-Zinc Oxide (GZO), Zinc-Tin Oxide (ZTO), Zinc-Magnesium Oxide (ZMO), Zinc-Zirconium Oxide (ZnZrxOy), Indium-Zinc-Tin oxide (IZTO), indium-gallium-zinc oxide (IGZO), indium-gallium-hafnium oxide (IGHO), tin-aluminum-zinc oxide (TAZO), indium-gallium-tin oxide (IGTO) and indium-tin-gallium-zinc oxide (ITGZO), or the like. These may be used alone or in combination with each other.

Meanwhile, FIG. 7 shows that the first active pattern ACT1 includes an oxide semiconductor. However, in an embodiment, the first active pattern ACT1 may include a silicon semiconductor.

The first insulating layer IL1 may be disposed on the first active pattern ACT1. The first insulating layer IL1 may insulate the first active pattern ACT1 from the first gate electrode GAT1. In an embodiment, the first insulating layer IL1 may include an inorganic insulating material.

The first gate electrode GAT1 may be disposed on the first insulating layer ILL The first gate electrode GAT1 may overlap the first active pattern ACT1. In an embodiment, the first gate electrode GAT1 may include a metal, an alloy, a conductive metal oxide, a transparent conductive material, or the like.

The second insulating layer IL2 may be disposed on the buffer layer BFR to cover the first active pattern ACT1 and the first gate electrode GAT1. In an embodiment, the second insulating layer IL2 may include an inorganic insulating material.

The second active pattern ACT2 may be disposed on the second insulating layer IL2. In an embodiment, the second active pattern ACT2 may be formed by depositing an oxide thin film on the second insulating layer IL2 using the sputtering apparatus 1000. Accordingly, the second active pattern ACT2 may include an oxide semiconductor. In other words, the oxide semiconductor included in the second active pattern ACT2 may correspond to the metal oxide included in the first target part 440 and the second target part 460 of the sputtering apparatus 1000.

Examples of the oxide semiconductor that can be used as the second active pattern ACT2 may include zinc oxide (ZnOx), gallium oxide (GaOx), tin oxide (SnOx), titanium oxide (TiOx), indium oxide (InOx), indium-Gallium Oxide (IGO), Indium-Zinc Oxide (IZO), Gallium-Zinc Oxide (GZO), Zinc-Tin Oxide (ZTO), Zinc-Magnesium Oxide (ZMO), Zinc-Zirconium Oxide (ZnZrxOy), Indium-Zinc-Tin oxide (IZTO), indium-gallium-zinc oxide (IGZO), indium-gallium-hafnium oxide (IGHO), tin-aluminum-zinc oxide (TAZO), indium-gallium-tin oxide (IGTO), indium-tin-gallium-zinc oxide (ITGZO), or the like. These may be used alone or in combination with each other.

The third insulating layer IL3 may be disposed on the second active pattern ACT2. The third insulating layer IL3 may insulate the second active pattern ACT2 from the second gate electrode GAT2. In an embodiment, the third insulating layer IL3 may include an inorganic insulating material.

The second gate electrode GAT2 may be disposed on the third insulating layer IL3. The second gate electrode GAT2 may overlap the second active pattern ACT2. In an embodiment, the second gate electrode GAT2 may include a metal, an alloy, a conductive metal oxide, a transparent conductive material, or the like.

The fourth insulating layer IL4 may be disposed on the second insulating layer IL2 to cover the second active pattern ACT2 and the second gate electrode GAT2. In an embodiment, the fourth insulating layer IL4 may include an inorganic insulating material.

The first to fourth connection electrodes CE1, CE2, CE3, and CE4 may be disposed on the fourth insulating layer IL4. Each of the first connection electrode CE1 and the second connection electrode CE2 may contact the first active pattern ACT1 through contact holes. Each of the third connection electrode CE3 and the fourth connection electrode CE4 may contact the second active pattern ACT2 through contact holes.

As described above, the first active pattern ACT1, the first gate electrode GAT1, the first connection electrode CE1, and the second connection electrode CE2 may constitute the driving transistor DTR. The second active pattern ACT2, the second gate electrode GAT2, the third connection electrode CE3, and the fourth connection electrode CE4 may constitute the switching transistor STR.

In an embodiment, when both the first active pattern ACT1 and the second active pattern ACT2 include an oxide semiconductor, both the driving transistor DTR and the switching transistor STR may be oxide transistors. However, when the first active pattern ACT1 includes a silicon semiconductor, the driving transistor DTR may be a silicon transistor in an embodiment.

When the first active pattern ACT1 and the second active pattern ACT2 are formed by depositing an oxide thin film using the sputtering target 400 according to embodiments, the uniformity of the deposited oxide thin film may be secured. Accordingly, performance of the driving transistor DTR and the switching transistor STR may be improved. Accordingly, performance of the display device DD may be improved.

The fifth insulating layer IL5 may be disposed on the fourth insulating layer IL4 to cover the first to fourth connection electrodes CE1, CE2, CE3, and CE4. In an embodiment, the fifth insulating layer IL5 may include an organic insulating material.

The light emitting device LED and the pixel defining layer PDL may be disposed on the fifth insulating layer IL5. The light emitting device LED may include an anode electrode ADE, a light emitting layer EL, and a cathode electrode CTE.

The anode electrode ADE may be disposed on the fifth insulating layer IL5. The anode electrode ADE may be electrically connected to the driving transistor DTR through a contact hole formed in the fifth insulating layer IL5.

The anode electrode ADE may include a metal, an alloy, a metal oxide, a transparent conductive material, or the like. Examples of materials that can be used as the anode electrode (ADE) MAY include silver (Ag), an alloy containing silver, molybdenum (Mo), an alloy containing molybdenum, aluminum (Al), an alloy containing aluminum, Aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium-tin oxide (ITO), indium-zinc oxide (IZO), and the like. These may be used alone or in combination with each other.

In an embodiment, when the anode electrode ADE includes a metal oxide, the anode electrode ADE may be formed by depositing an oxide thin film using the sputtering apparatus 1000. In other words, the metal oxide included in the anode electrode ADE may correspond to the metal oxide included in the first target part 40 and the second target part 460 of the sputtering apparatus 1000.

The pixel defining layer PDL may be disposed on the fifth insulating layer IL5. A pixel opening extending to and exposing a portion of the anode electrode ADE may be defined in the pixel defining layer PDL. In an embodiment, the pixel defining layer PDL may include an organic material.

The light emitting layer EL may be disposed on the anode electrode ADE. In an embodiment, the light emitting layer EL may be disposed on the anode electrode ADE exposed by the pixel opening. In an embodiment, the light emitting layer EL may be disposed on the anode electrode ADE and the pixel defining layer PDL.

The cathode electrode CTE may be disposed on the light emitting layer EL. The light emitting layer EL may emit light based on a voltage difference between the anode electrode ADE and the cathode electrode CTE.

Meanwhile, a structure of the display device DD shown in FIG. 7 is only an example, and may be variously changed. For example, any one of several components included in the display device DD may be omitted, or components not shown in FIG. 7 may be further included. Also, a connection structure of various elements included in the display device DD may be variously changed.

Meanwhile, the display device DD is limited to an organic light emitting display device (OLED). However, in an embodiment, the display device (DD) may be a liquid crystal display device (LCD), a field emission display device (FED), a plasma display device (PDP), an electrophoretic display device (EPD), a quantum dot display device, or an inorganic light emitting display device.

A sputtering apparatus according to embodiments may include a sputtering target including a first target part, a second target part, and a target dividing part disposed between the first target part and the second target part. In other words, the sputtering target may have a structure including the first target part and the second target part divided by the target dividing part. Accordingly, the size and/or length of the sputtering target may be increased. Accordingly, it may be easy to design the sputtering target suitable for a substrate having a large size. Thus, efficiency of a manufacturing process of the sputtering target may be improved and a manufacturing cost may be reduced.

In addition, the target dividing part may include a same metal element as a metal element included in the first target part and the second target part. Accordingly, even after a thin film is deposited on a target substrate using the sputtering target, stains caused by sputtering of non-uniform amounts of metal elements by location on the target substrate may not occur on the target substrate. In addition, the uniformity of the thin film deposited on the target substrate may be secured by using the sputtering target. Thus, process quality of the sputtering process may be improved. In addition, performance of the oxide transistor formed by a sputtering process using the sputtering apparatus may be improved. Accordingly, performance of a display device including the oxide transistor may be improved.

The inventive concept should not be construed as being limited to the embodiments set forth herein. Rather, these embodiments are provided so that this disclosure will be thorough and complete and will fully convey the concept of the inventive concept to those skilled in the art.

While the inventive concept has been particularly shown and described with reference to embodiments thereof, it will be understood by those of ordinary skill in the art that various changes in form and details may be made therein without departing from the spirit or scope of the inventive concept as defined by the following claims.

What is claimed is:

1. A sputtering target comprising:
a first target part and a second target part adjacent to each other, the first target part and the second target part both including a metal oxide; and
a target dividing part disposed between the first target part and the second target part and including a same metal element as a metal element included in the first target part and the second target part, the target dividing part having an absence of the metal oxide of the first target part and the second target part, wherein each of the first target part, the second target part, and the target dividing part includes a plurality of the metal elements, and
wherein a composition ratio of the metal elements included in the target dividing part is the same as a composition ratio of the metal elements included in each of the first target part and the second target part.

2. The sputtering target of claim 1, wherein the metal oxide includes at least one selected from the group consisting of zinc oxide (ZnOx), gallium oxide (GaOx), tin oxide (SnOx), titanium oxide (TiOx), indium oxide (InOx), indium-gallium oxide (IGO), indium-Zinc Oxide (IZO), Gallium-Zinc Oxide (GZO), Zinc-Tin Oxide (ZTO), Zinc-Magnesium Oxide (ZMO), Zinc-Zirconium Oxide (ZnZrxOy), Indium-Zinc-Tin Oxide (IZTO), Indium-Zinc Oxide (IZTO) gallium-zinc oxide (IGZO), indium-gallium-hafnium oxide (IGHO), tin-aluminum-zinc oxide (TAZO), indium-gallium-tin oxide (IGTO), and indium-tin-gallium-zinc oxide (ITGZO).

3. The sputtering target of claim 2, wherein the metal element includes at least one selected from the group consisting of zinc (Zn), gallium (Ga), tin (Sn), indium (In), titanium (Ti), magnesium (Mg), zirconium (Zr), aluminum (Al), and hafnium (Hf).

4. The sputtering target of claim 1, wherein each of the first target part and the second target part includes indium-gallium-zinc oxide (IGZO),
wherein the target dividing part includes indium (In), gallium (Ga), and zinc (Zn), and
wherein a content of indium (In) of the target dividing part, a content of gallium (Ga) of the target dividing part, and a content of zinc (Zn) of the target dividing part are the same.

5. The sputtering target of claim 1, wherein the first target part and the second target part are spaced apart from each other.

6. The sputtering target of claim 5, wherein the target dividing part is disposed to fill a space between the first target part and the second target part.

7. The sputtering target of claim 1, further comprising:
a rotating roller supporting the first target part and the second target part.

8. The sputtering target of claim 7, wherein the first target part and the second target part surround the rotating roller.

9. The sputtering target of claim 7, wherein the rotating roller has a cylindrical shape.

10. The sputtering target of claim 7, wherein the first target part and the second target part have a cylindrical shape.

11. The sputtering target of claim 1, wherein the first target part and the second target part have a flat plate shape.

12. A sputtering apparatus comprising:
a chamber defining an inner space;
a stage disposed in the chamber and on which a target substrate is configured to be disposed;
a plate disposed in the chamber and facing the stage;
a sputtering target disposed on the plate, the sputtering target comprising:
a first target part and a second target part adjacent to each other, the first target part and the second target part including a metal oxide; and
a target dividing part disposed between the first target part and the second target part and including a same metal element as a metal element included in the first target part and the second target part, the target dividing part having an absence of the metal oxide of the first target part and the second target part, wherein each of the first target part, the second target part, and the target dividing part includes a plurality of the metal elements, and
wherein a composition ratio of the metal elements included in the target dividing part is the same as a composition ratio of the metal elements included in each of the first target part and the second target part.

13. The sputtering apparatus of claim 12, wherein oxygen exists in the inner space of the chamber.

14. The sputtering apparatus of claim 13, wherein the oxygen is deposited on the target substrate by reacting with the metal element of the target dividing part.

15. The sputtering apparatus of claim 12, wherein the metal oxide includes at least one selected from the group consisting of zinc oxide (ZnOx), gallium oxide (GaOx), tin oxide (SnOx), titanium oxide (TiOx), indium oxide (InOx), indium-gallium oxide (IGO), indium-Zinc Oxide (IZO), Gallium-Zinc Oxide (GZO), Zinc-Tin Oxide (ZTO), Zinc-Magnesium Oxide (ZMO), Zinc-Zirconium Oxide (ZnZrxOy), Indium-Zinc-Tin Oxide (IZTO), Indium-Zinc Oxide (IZTO) gallium-zinc oxide (IGZO), indium-gallium-hafnium oxide (IGHO), tin-aluminum-zinc oxide (TAZO), indium-gallium-tin oxide (IGTO), and indium-tin-gallium-zinc oxide (ITGZO).

16. The sputtering apparatus of claim 15, wherein the metal element includes at least one selected from the group consisting of zinc (Zn), gallium (Ga), tin (Sn), indium (In), titanium (Ti), magnesium (Mg), zirconium (Zr), aluminum (Al), and hafnium (Hf).

17. The sputtering apparatus of claim 12, wherein the first target part and the second target part are spaced apart from each other.

18. The sputtering apparatus of claim 17, wherein the target dividing part is disposed to fill a space between the first target part and the second target part.

* * * * *